United States Patent
Raihn et al.

(10) Patent No.: US 9,608,595 B1
(45) Date of Patent: Mar. 28, 2017

(54) ACOUSTIC WAVE FILTER WITH ENHANCED REJECTION

(71) Applicant: RESONANT INC., Santa Barbara, CA (US)

(72) Inventors: Kurt F. Raihn, Goleta, CA (US); Gregory L. Hey-Shipton, Santa Barbara, CA (US)

(73) Assignee: RESONANT INC., Santa Barbara, CA (US)

( * ) Notice: Subject to any disclaimer, the term of this patent is extended or adjusted under 35 U.S.C. 154(b) by 0 days.

(21) Appl. No.: 14/941,451

(22) Filed: Nov. 13, 2015

(51) Int. Cl.
*H03H 9/64* (2006.01)
*H03H 9/54* (2006.01)
*H03H 9/60* (2006.01)

(52) U.S. Cl.
CPC ............ *H03H 9/542* (2013.01); *H03H 9/54* (2013.01); *H03H 9/605* (2013.01); *H03H 9/6483* (2013.01)

(58) Field of Classification Search
CPC .......... H03H 9/542; H03H 9/605; H03H 9/64; H03H 9/6406; H03H 9/6423; H03H 9/6483
USPC ......................................... 333/193–195, 189
See application file for complete search history.

(56) References Cited

U.S. PATENT DOCUMENTS

| 5,821,834 | A | * | 10/1998 | Xu | H03H 9/0057 310/313 B |
| 5,933,062 | A | * | 8/1999 | Kommrusch | H03H 9/6483 310/313 B |
| 6,018,281 | A | * | 1/2000 | Taguchi | H03H 9/64 310/313 R |
| 6,043,585 | A | * | 3/2000 | Plessky | H03H 9/1455 310/313 D |
| 6,593,678 | B1 | * | 7/2003 | Flowers | H03H 9/0542 310/313 R |
| 6,653,913 | B2 | * | 11/2003 | Klee | H03H 3/04 333/188 |
| 7,034,638 | B2 | * | 4/2006 | Yamamoto | H03H 9/6483 310/313 R |
| 7,616,079 | B2 | * | 11/2009 | Tikka | H03H 9/583 333/189 |
| 8,179,211 | B2 | * | 5/2012 | Bauer | H03H 9/0542 333/193 |

(Continued)

FOREIGN PATENT DOCUMENTS

| JP | 05-022074 | * | 1/1993 |
| JP | 08-065089 | * | 3/1996 |

(Continued)

OTHER PUBLICATIONS

K.S. Van Dyke, Piezo-Electric Resonator and its Equivalent Network Proc. IRE, vol. 16, 1928, pp. 742-764.

*Primary Examiner* — Barbara Summons
(74) *Attorney, Agent, or Firm* — Vista IP Law Group LLP

(57) ABSTRACT

A narrow-band acoustic filter comprises an input and an output, and at least one acoustic resonator pair coupled between the input and the output. Each of the acoustic resonator pair(s) comprises at least one in-line acoustic resonator and in-shunt acoustic resonator that operate together to create a nominal passband. The acoustic filter further comprises at least one capacitive element in parallel with one of the in-line acoustic resonator and the in-shunt acoustic resonator of each of the acoustic resonator pair(s), thereby sharpening one of a lower edge and an upper edge of the nominal passband.

13 Claims, 19 Drawing Sheets

(56) References Cited

U.S. PATENT DOCUMENTS

| | | | | |
|---|---|---|---|---|
| 8,552,818 B2 * | 10/2013 | Kadota | .............. | H03H 9/02559 |
| | | | | 333/188 |
| 2005/0212612 A1 * | 9/2005 | Kawakubo | ............. | H03H 9/542 |
| | | | | 331/117 R |

FOREIGN PATENT DOCUMENTS

| JP | 2002-299997 | * 10/2002 |
|---|---|---|
| JP | 2013-243570 | * 12/2013 |

* cited by examiner

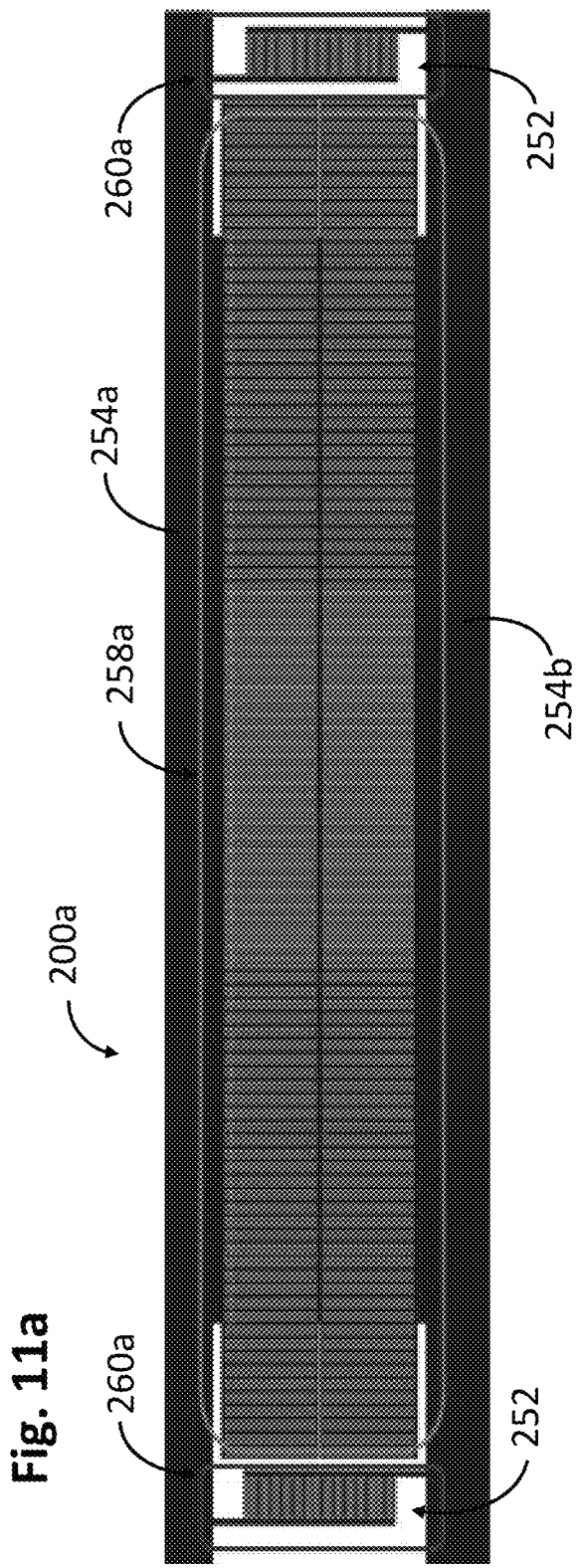

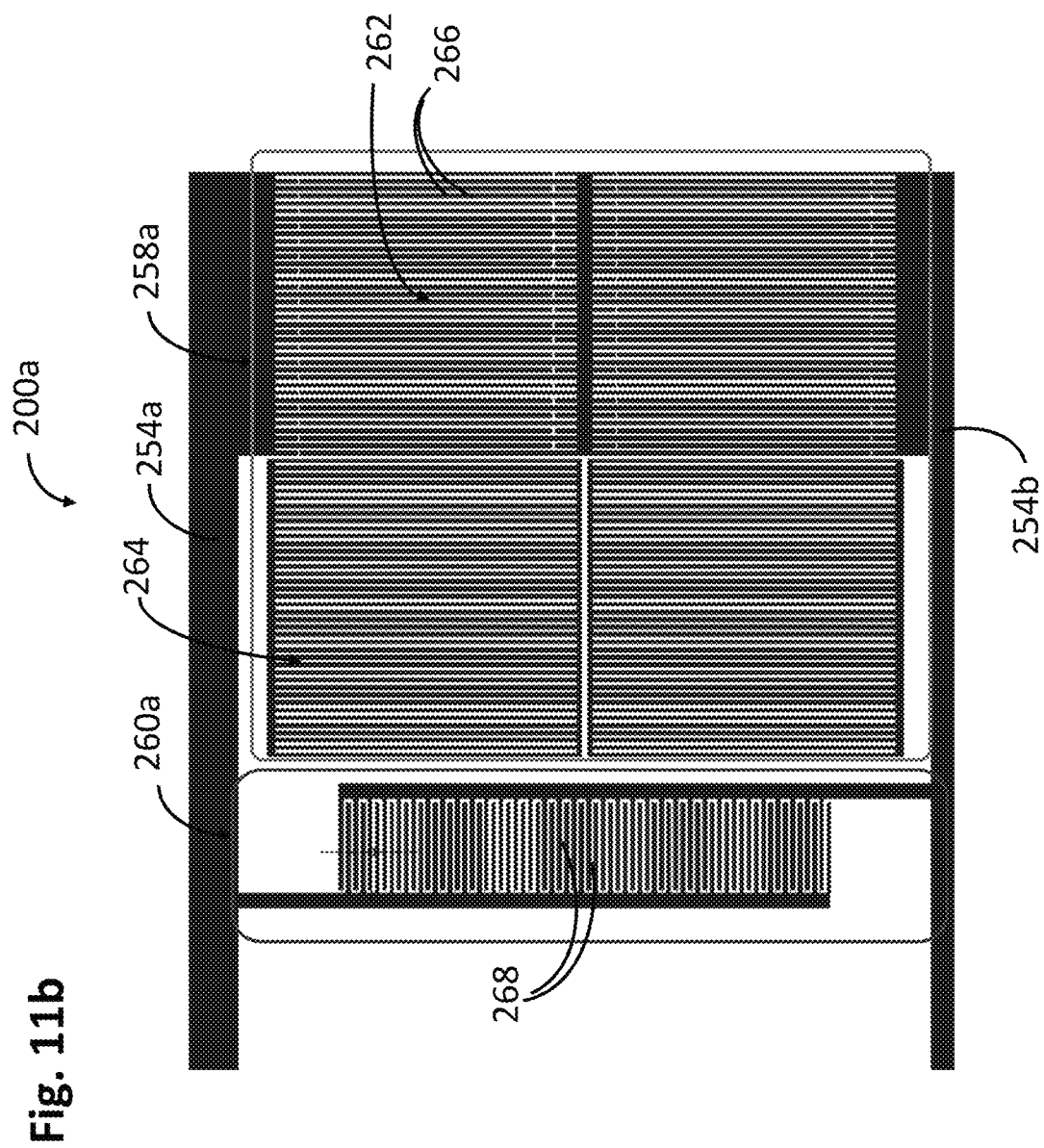

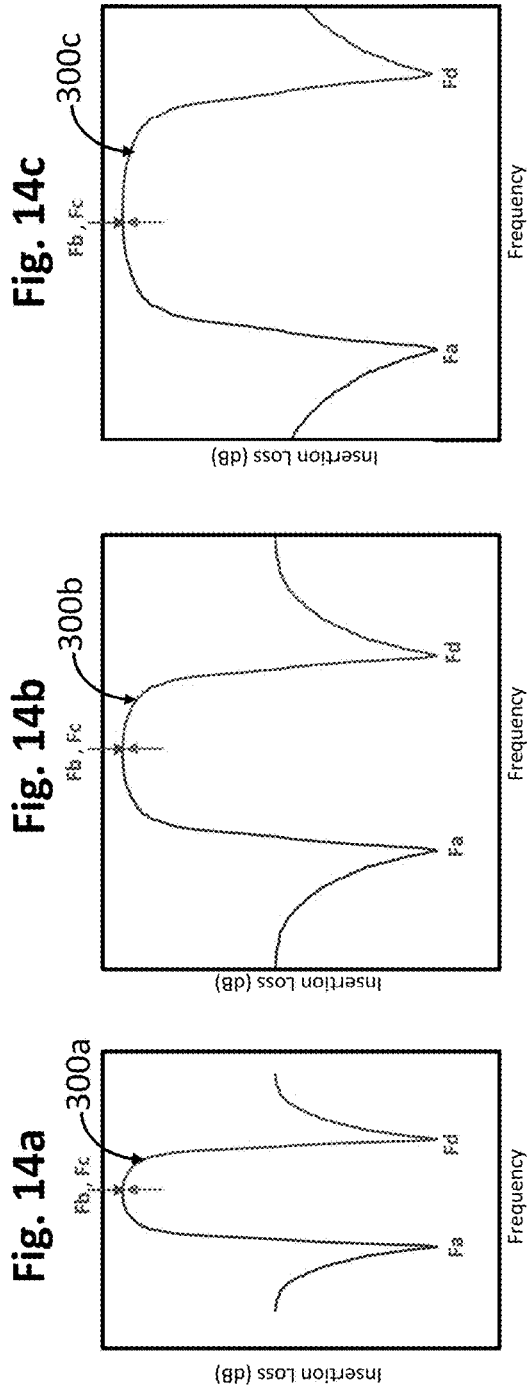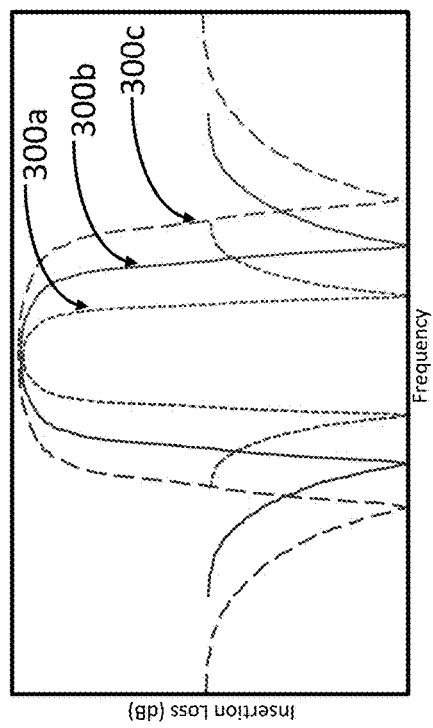

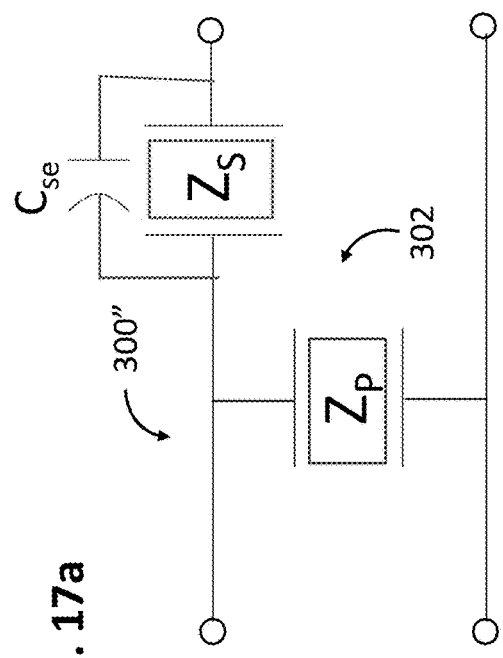
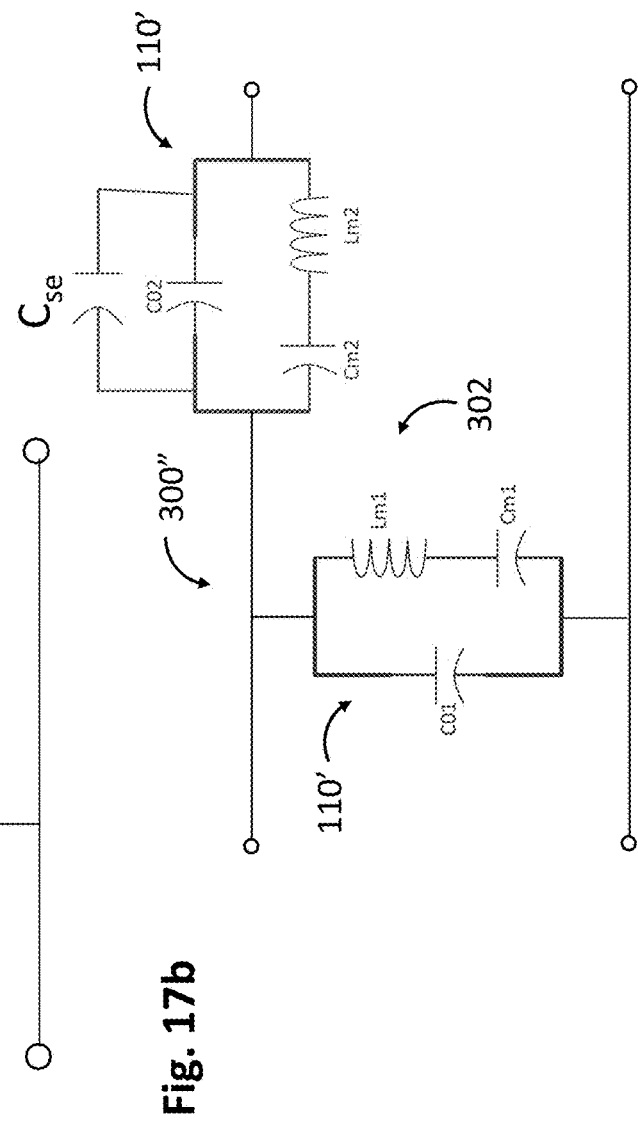
Fig. 17a
Fig. 17b

ACOUSTIC WAVE FILTER WITH ENHANCED REJECTION

FIELD OF THE INVENTION

The present inventions generally relate to microwave filters, and more particularly, to acoustic microwave filters designed for narrow-band applications.

BACKGROUND OF THE INVENTION

Electrical filters have long been used in the processing of electrical signals. In particular, such electrical filters are used to select desired electrical signal frequencies from an input signal by passing the desired signal frequencies, while blocking or attenuating other undesirable electrical signal frequencies. Filters may be classified in some general categories that include low-pass filters, high-pass filters, band-pass filters, and band-stop filters, indicative of the type of frequencies that are selectively passed by the filter. Further, filters can be classified by type, such as Butterworth, Chebyshev, Inverse Chebyshev, and Elliptic, indicative of the type of bandshape frequency response (frequency cutoff characteristics) the filter provides relative to the ideal frequency response.

The type of filter used often depends upon the intended use. In communications applications, band pass and band stop filters are conventionally used in cellular base stations, cell phone handsets, and other telecommunications equipment to filter out or block RF signals in all but one or more predefined bands. Of most particular importance is the frequency range from approximately 500-3,500 MHz. In the United States, there are a number of standard bands used for cellular communications. These include Band 2 (~1800-1900 MHz), Band 4 (~1700-2100 MHz), Band 5 (~800-900 MHz), Band 13 (~700-800 MHz), and Band 17 (~700-800 MHz); with other bands emerging.

Microwave filters are generally built using two circuit building blocks: a plurality of resonators, which store energy very efficiently at a resonant frequency (which may be a fundamental resonant frequency $f_0$ or any one of a variety of higher order resonant frequencies $f_1$-$f_n$); and couplings, which couple electromagnetic energy between the resonators to form multiple reflection zeros providing a broader spectral response. For example, a four-resonator filter may include four reflection zeros. The strength of a given coupling is determined by its reactance (i.e., inductance and/or capacitance). The relative strengths of the couplings determine the filter shape, and the topology of the couplings determines whether the filter performs a band-pass or a band-stop function. The resonant frequency $f_0$ is largely determined by the inductance and capacitance of the respective resonator. For conventional filter designs, the frequency at which the filter is active is determined by the resonant frequencies of the resonators that make up the filter. Each resonator must have very low internal resistance to enable the response of the filter to be sharp and highly selective for the reasons discussed above. This requirement for low resistance tends to drive the size and cost of the resonators for a given technology.

The duplexer, a specialized kind of filter is a key component in the front-end of mobile devices. Modern mobile communications devices transmit and receive at the same time (using LTE, WCDMA or CDMA) and use the same antenna. The duplexer separates the transmit signal, which can be up to 0.5 Watt power, from the receive signal, which can be as low as a pico-Watt. The transmit and receive signals are modulated on carriers at different frequencies allowing the duplexer to select them, even so the duplexer must provide the frequency selection, isolation and low insertion loss in a very small size often only about two millimeters square.

The front-end receive filter preferably takes the form of a sharply defined band-pass filter to eliminate various adverse effects resulting from strong interfering signals at frequencies near the desired received signal frequency. Because of the location of the front-end receiver filter at the antenna input, the insertion loss must be very low so as to not degrade the noise figure. In most filter technologies, achieving a low insertion loss requires a corresponding compromise in filter steepness or selectivity.

In practice, most filters for cell phone handsets are constructed using acoustic resonator technology, such as surface acoustic wave (SAW), bulk acoustic wave (BAW), and film bulk acoustic resonator (FBAR) technologies. The equivalent circuit of an acoustic resonator has two resonances closely spaced in frequency called the "resonance" frequency and the "anti-resonance" frequency (see K. S. Van Dyke, Piezo-Electric Resonator and its Equivalent Network Proc. IRE, Vol. 16, 1928, pp. 742-764). Such acoustic resonator filters have the advantages of low insertion loss (on the order of 1 dB at the center frequency), compact size, and low cost compared to equivalent inductor/capacitor resonators. For this reason, acoustic resonator implementations are often used for microwave filtering applications in the front-end receive filter of mobile devices.

Acoustic resonators are typically arranged in a ladder topology (alternating series and shunt resonators) in order to create band pass filters. Acoustic ladder filters have been very successful for handset applications, with more than a billion units currently sold each year. However, the recent trend in wireless technology towards multifunctional devices and a more crowded electromagnetic spectrum requires filters for ever more bands with sharper line shapes, while simultaneously demanding reduction in the size, cost, and power consumption.

In addition to sharpening the line shapes of filter passbands, it is also desirable to ensure that discontinuities in the frequency response reside as far outside of the pass band as possible. For example, a typical acoustic resonator has a plurality of interdigitized fingers (e.g., 80-100 fingers) that reflect acoustic waves back and forth between the fingers. The frequency band over which the acoustic reflections between the fingers add in phase to create the resonance may be referred to as the "Bragg Band." A discontinuity feature in the frequency response occurs at the upper edge of the Bragg Band, i.e., the highest frequency at which the acoustic reflections add in phase. This Bragg resonance can distort the high side of the passband of the bandpass filter, resulting in excessive loss at these frequencies. Thus, because the performance of the filter may be compromised if this discontinuity feature falls within the passband, it is important to ensure that the discontinuity feature falls well outside of the passband of the filter.

SUMMARY OF THE INVENTION

In accordance with a first aspect of the present inventions, a narrow-band acoustic filter is provided. The acoustic filter may operate at microwave frequencies in the range of 300 MHz to 300 GHz, but is most applicable at frequencies in the range of 300 MHz to 10 GHz, and most particularly, at frequencies in the range of 500 MHz to 3.5 GHz.

The acoustic filter comprises an input and an output, and at least one acoustic resonator pair (e.g., at least four acoustic resonator pairs) coupled between the input and the output. Each of the acoustic resonator pair(s) comprises at least one in-line acoustic resonator and in-shunt acoustic resonator that operate together to create a nominal passband. Each of the in-line acoustic resonator and in-shunt acoustic resonator may, e.g., be one of a surface acoustic wave (SAW) resonator, a bulk acoustic wave (BAW) resonator, a film bulk acoustic resonator (FBAR), and a microelectromechanical system (MEMS) resonator. The acoustic resonator pair(s) may, e.g., be arranged in an Nth-order ladder topology.

The acoustic filter further comprises at least one capacitive element in parallel with one of the in-line acoustic resonator and the in-shunt acoustic resonator of each of the acoustic resonator pair(s), thereby sharpening one of a lower edge and an upper edge of the nominal passband. In one embodiment, the acoustic filter further comprises at least another capacitive element in parallel with the other of the in-line acoustic resonator and the in-shunt acoustic resonator of each of the acoustic resonator pair(s), thereby sharpening the lower edge and the upper edge of the nominal passband. The capacitive element(s) may have a capacitance in the range of 0.5 pF-2.0 pF, specifically, in the range of 0.8 pF-1.5 pF, and more specifically, in the range of 0.9 pF-1.1 pF.

In accordance with a second aspect of the present inventions, an acoustic filter comprises a piezoelectric layer, an acoustic resonator structure monolithically disposed on the piezoelectric layer, and a lumped capacitive structure monolithically disposed on the piezoelectric layer and being electrically coupled in parallel with the acoustic resonator structure. The piezoelectric layer may, e.g., be a piezoelectric substrate, or the acoustic filter may comprise a non-piezoelectric substrate, in which case, the piezoelectric layer may be monolithically disposed on the non-piezoelectric substrate as, e.g., a thin-film piezoelectric.

In one embodiment, the acoustic filter comprises a metalized signal plane monolithically disposed on the piezoelectric layer, and a metalized ground plane monolithically disposed on the piezoelectric layer. Each of the acoustic resonator structure and the capacitive structure is electrically coupled between the signal plane and the ground plane. In this case, the acoustic resonator structure may be directly connected to the signal plane and the ground plane and/or the lumped capacitive structure may be directly connected to at least one of the signal plane and the ground plane. The lumped capacitive structure may be at least partially nested, and perhaps even fully nested, within the signal plane and/or the ground plane.

In another embodiment, the acoustic filter comprises a metalized input signal plane portion monolithically disposed on the piezoelectric layer, and a metalized output signal plane portion monolithically disposed on the piezoelectric layer. Each of the acoustic resonator structure and the capacitive structure is electrically coupled between the input signal plane portion and the output signal plane portion. In this case, the acoustic resonator structure may be directly connected to the input signal plane portion and the output signal plane portion and/or the lumped capacitive structure may be directly connected to at least one of the input signal plane portion and the output signal plane portion. The lumped capacitive structure may be at least partially nested, and perhaps even fully nested, within the input signal plane portion and/or the output signal plane portion.

In still another embodiment, the acoustic resonator structure comprises an arrangement of planar interdigitated resonator fingers, and the lumped capacitive structure comprises an arrangement of planar interdigitated capacitive fingers. In this case, the interdigitated capacitive fingers and interdigitated resonator fingers may be orthogonal to each other.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 11a is a plan view of an actual in-line acoustic resonator with additional capacitive elements fabricated for use in the enhanced acoustic filter of FIG. 5;

FIG. 11b is a plan view of a portion of the actual acoustic resonator of FIG. 11;

FIG. 13b is a schematic diagram illustrating the MBVD equivalent circuit of the conventional acoustic filter circuit of FIG. 13a;

FIGS. 14a-14c are frequency response plots of passbands of varying bandwidths;

FIG. 15 is a frequency response plot comparing the passbands of FIG. 14a-14c;

FIG. 16b is a schematic diagram illustrating the MBVD equivalent circuit of the enhanced acoustic filter circuit of FIG. 16a;

FIG. 17a is a schematic diagram of an enhanced single section band-pass acoustic filter circuit, wherein a capacitive element is added in parallel with the in-line resonator;

FIG. 17b is a schematic diagram illustrating the MBVD equivalent circuit of the enhanced acoustic filter circuit of FIG. 17a;

DETAILED DESCRIPTION OF THE EMBODIMENTS

Figure 1:
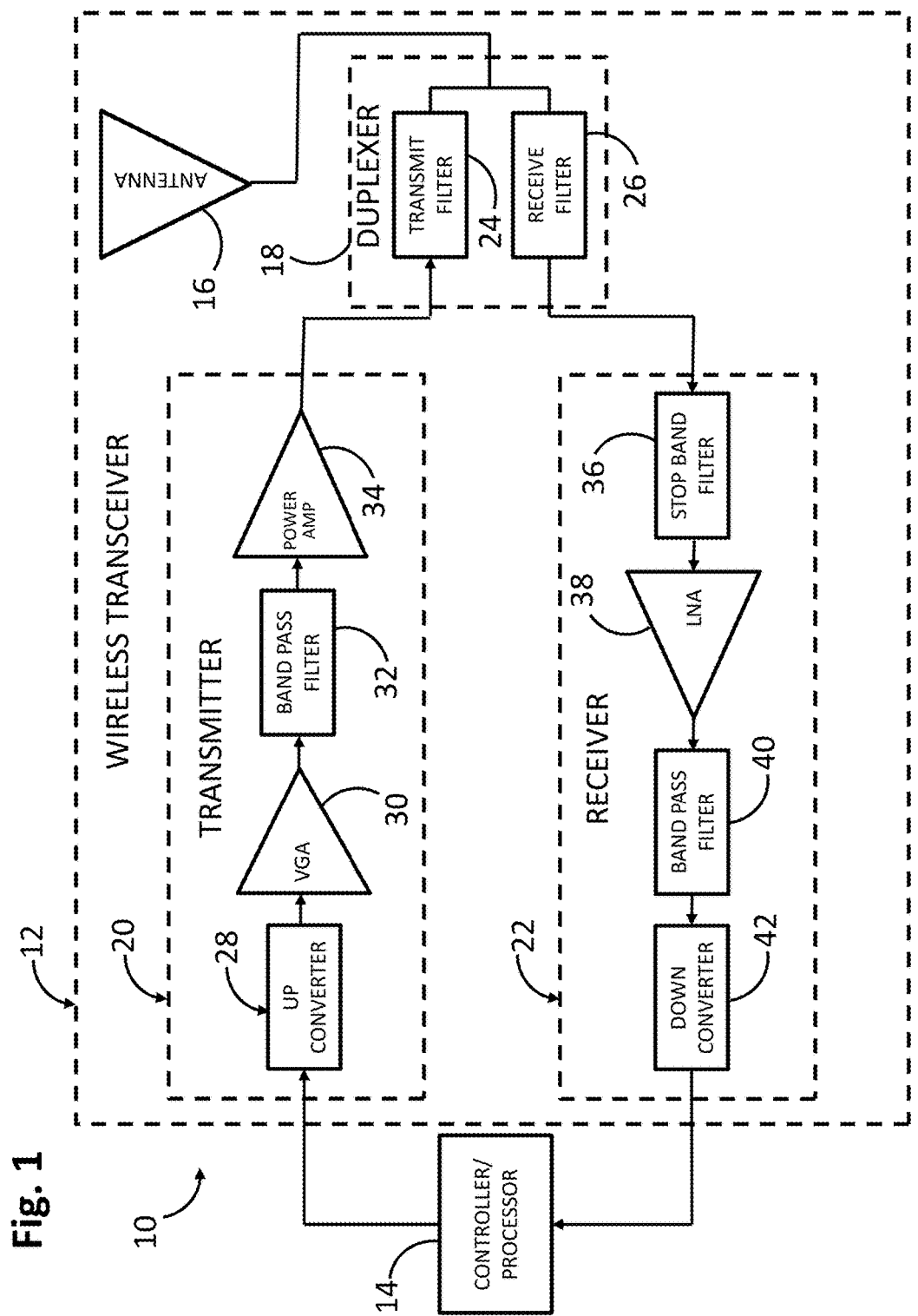
FIG. 1 is a block diagram of a wireless telecommunications system.

The present disclosure describes a design technique that enhances the rejection on one or both sides of a passband of an acoustic wave (AW) microwave filter, such as, e.g., a surface acoustic wave (SAW), bulk acoustic wave (BAW), film bulk acoustic resonator (FBAR), or microelectromechanical system (MEMS) filter. This technique uses standard manufacturing techniques and can be implemented without altering the overall size of the chip on which the microwave filter is disposed. This technique can be very useful when implemented in band gap contiguous duplexers. Increased rejection is also achieved in the neighboring band. Frequencies further out-of-band, both above and below the passband, can be rejected more, which will help in preventing unwanted signals interfering with the performance of the front-end receiver. Narrow band filters/duplexers can be designed, which increases the number of designs possible for a given piezoelectric material. The acoustic microwave filter may operate at microwave frequencies in the range of 300 MHz to 300 GHz, but is most applicable at frequencies in the range of 300 MHz to 10 GHz, and most particularly, at frequencies in the range of 500 MHz to 3.5 GHz.

The AW microwave filter described herein exhibits a frequency response with a single passband, which is particularly useful in telecommunication system duplexers where a passband with a closely spaced stopband is required. For example, with reference to FIG. 1, a telecommunications system 10 for use in a mobile communications device may include a transceiver 12 capable of transmitting and receiving wireless signals, and a controller/processor 14 capable of controlling the functions of the transceiver 12. The transceiver 12 generally comprises a broadband antenna 16, a duplexer 18 having a transmit filter 24 and a receive filter 26, a transmitter 20 coupled to the antenna 16 via the transmit filter 24 of the duplexer 18, and a receiver 22 coupled to the antenna 16 via the receive filter 26 of the duplexer 18.

The transmitter 20 includes an upconverter 28 configured for converting a baseband signal provided by the controller/processor 14 to a radio frequency (RF) signal, a variable gain amplifier (VGA) 30 configured for amplifying the RF signal, a bandpass filter 32 configured for outputting the RF signal at an operating frequency selected by the controller/processor 14, and a power amplifier 34 configured for amplifying the filtered RF signal, which is then provided to the antenna 16 via the transmit filter 24 of the duplexer 18.

The receiver 22 includes a notch or stopband filter 36 configured for rejecting transmit signal interference from the RF signal input from the antenna 16 via the receiver filter 26, a low noise amplifier (LNA) 38 configured for amplifying the RF signal from the stop band filter 36 with a relatively low noise, a tunable bandpass filter 40 configured for outputting the amplified RF signal at a frequency selected by the controller/processor 14, and a downconverter 42 configured for downconverting the RF signal to a baseband signal that is provided to the controller/processor 14. Alternatively, the function of rejecting transmit signal interference performed by the stop-band filter 36 can instead be performed by the duplexer 18. Or, the power amplifier 34 of the transmitter 20 can be designed to reduce the transmit signal interference.

It should be appreciated that the block diagram illustrated in FIG. 1 is functional in a nature, and that several functions can be performed by one electronic component or one function can be performed by several electronic components. For example, the functions performed by the up converter 28, VGA 30, bandpass filter 40, downconverter 42, and controller/processor 14 are oftentimes performed by a single transceiver chip. The function of the bandpass filter 32 can be into the power amplifier 34 and the transmit filter 24 of the duplexer 18.

The exemplary design technique described herein is used to design acoustic microwave filters for the front-end of the telecommunications system 10, and in particular, the transmit filter 24 of the duplexer 18, although the same technique can be used to design acoustic microwave filters for the receive filter 26 of the duplexer 18 and for other RF filters.

Figure 2:
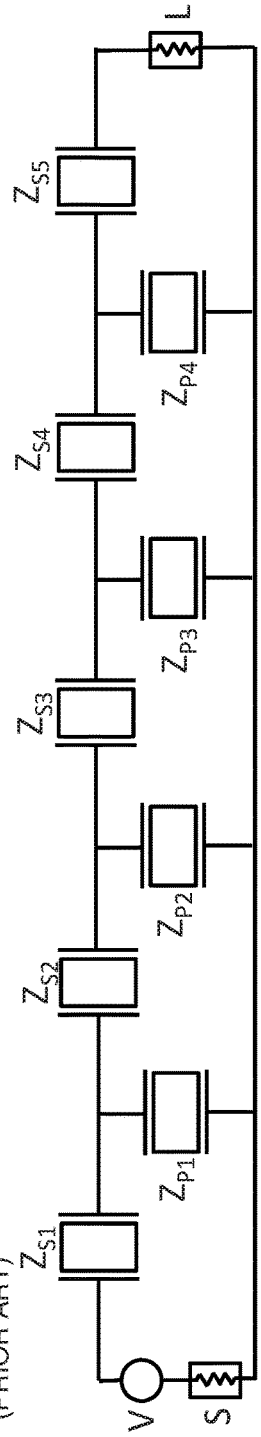
FIG. 2 is a schematic diagram of a conventional microwave acoustic filter arranged in an Nth order ladder topology.

Referring now to FIG. 2, one embodiment of a conventional band pass filter 100 will be described. The filter 100 is arranged in an Nth-order ladder topology (i.e., in this case, N=9 meaning the number of resonators equals 9). The filter 100 comprises a voltage source V, a source resistance S, a load resistance L, five series (or in-line) acoustic resonators $Z_{S1}$-$Z_{S5}$, and four parallel (or in-shunt) acoustic resonators $Z_{P1}$-$Z_{P4}$.

Figure 3:
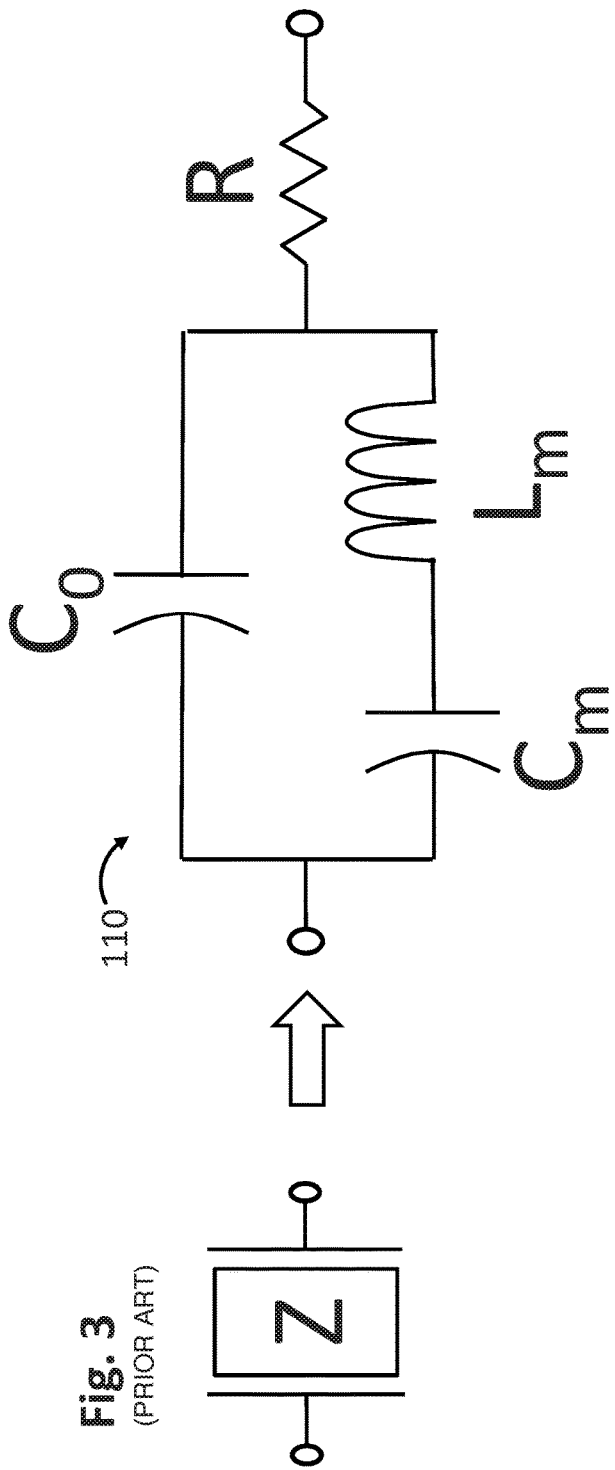
FIG. 3 is a schematic diagram illustrating the transformation of an acoustic resonator of the acoustic filter of FIG. 2 into an equivalent modified Butterworth-Van Dyke (MBVD) model.

Referring to FIG. 3, each of the acoustic resonators Z may be described by a modified Butterworth-Van Dyke (MBVD) model 110. MBVD models 110 may also describe SAW resonators, which may be fabricated by disposing interdigital transducers (IDTs) on a piezoelectric substrate, such as crystalline Quartz, Lithium Niobate ($LiNbO_3$), Lithium Tantalate ($LiTaO_3$) crystals or BAW (including FBAR) resonators or MEMS resonators. Each MBVD model 110 includes a motional capacitance $C_m$, a static capacitance $C_0$, a motional inductance $L_m$, and a resistance R. The motional capacitance $C_m$ and motional inductance $L_m$ may result from the interactions of electrical and acoustical behavior, and thus, may be referred to as the motional arm of the MBVD model. The static capacitance $C_0$ may result from the capacitance of the structure, and thus, may be referred to as the static (non-motional) capacitance of the MBVD model. The resistance R may result from the electrical resistance of the acoustic resonator.

Figure 4:
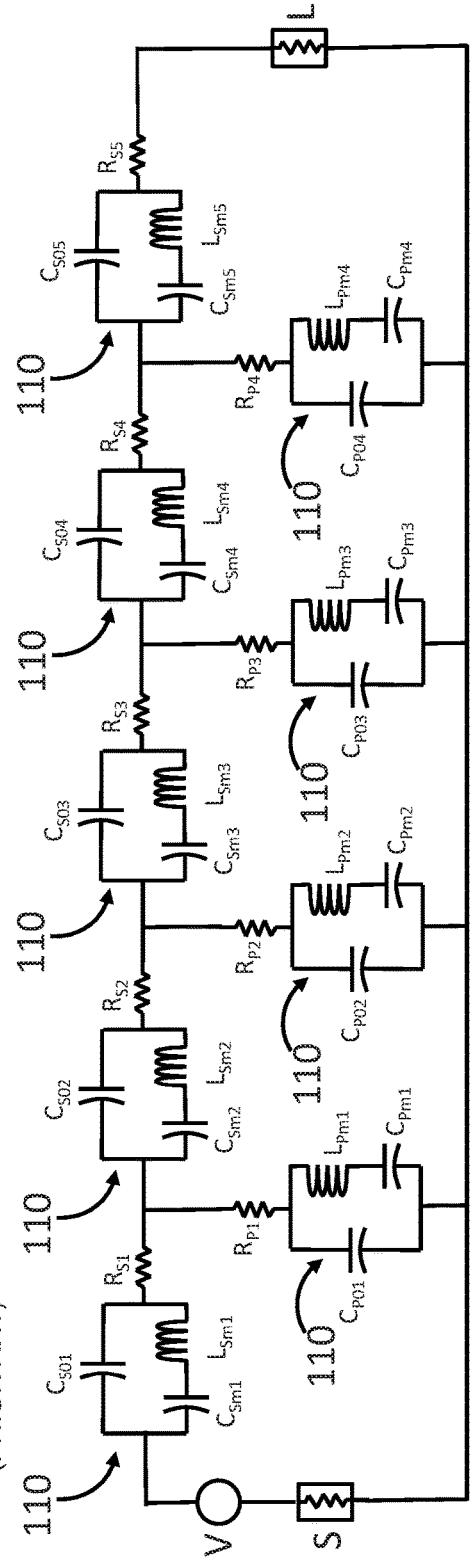
FIG. 4 is a schematic diagram illustrating the MBVD equivalent circuit of the conventional acoustic filter of FIG. 2.
Figure 5:
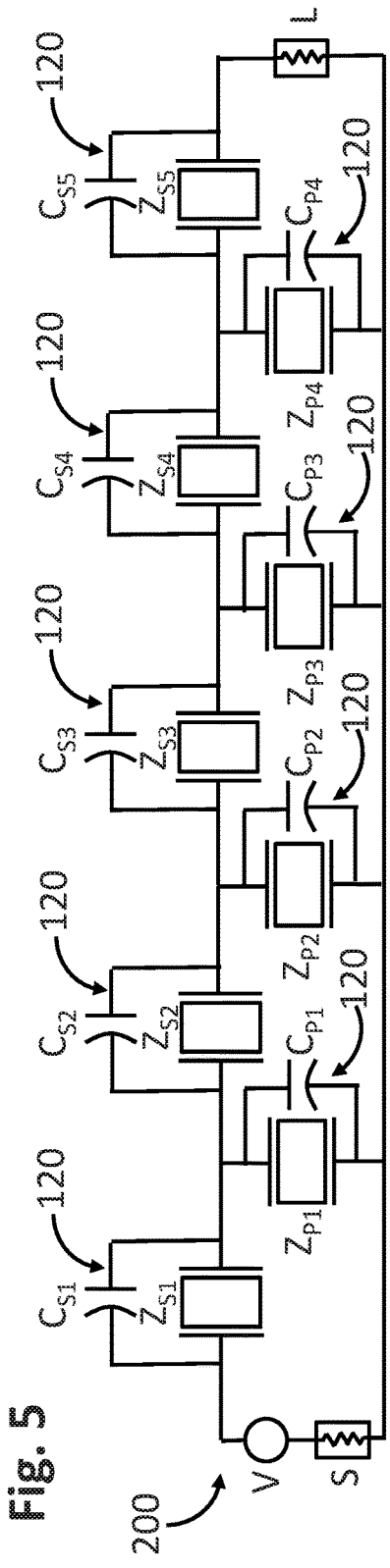
FIG. 5 is a schematic diagram illustrating an enhanced microwave acoustic filter constructed in accordance with one embodiment of the present inventions.
Figure 6:
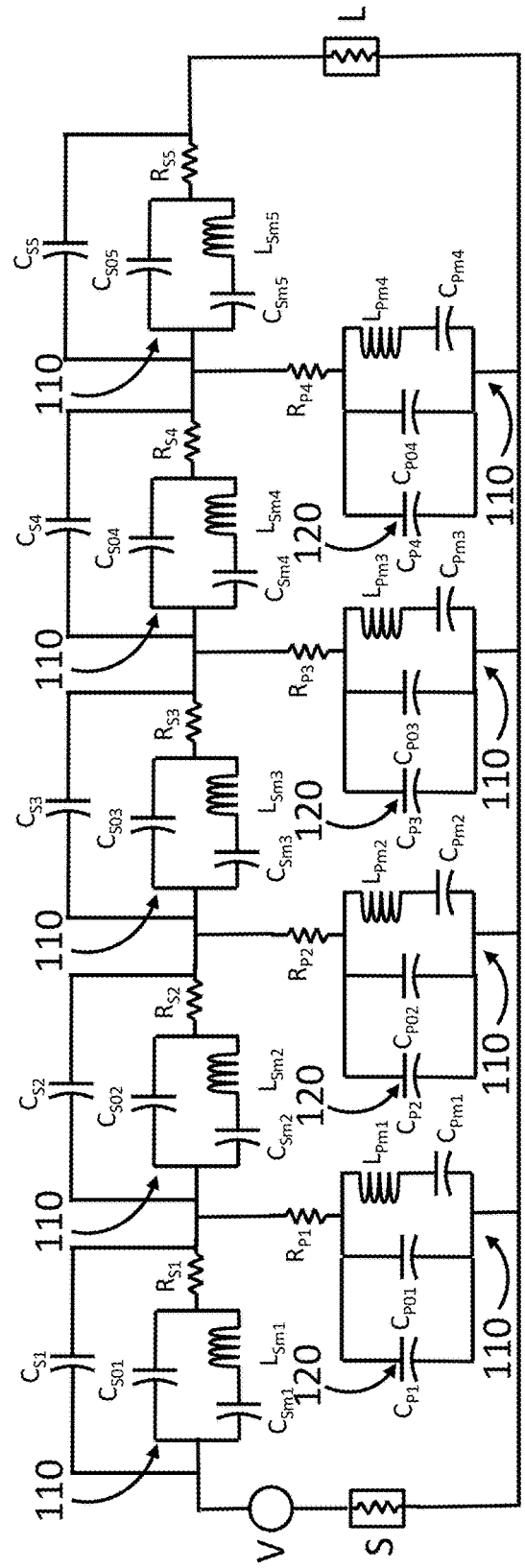
FIG. 6 is a schematic diagram illustrating the MBVD equivalent circuit of the enhanced acoustic filter of FIG. 5.

Referring to FIG. 4, each of the acoustic resonators Z of the conventional filter 100 can be replaced with the MBVD model 110 illustrated in FIG. 3. Significant to the present inventions, it has been discovered that the in-band and out-of-band rejection of the conventional band-pass filter 100 can be significantly improved by adding at least one capacitive element in parallel with at least one of the acoustic resonators 110. For example, as illustrated in FIG. 5, an embodiment of an enhanced band-pass filter 200 with improved in-band and out-of-band rejection is similar to the conventional band-pass filter 100, with the exception that the enhanced band-pass filter 200 comprises a plurality of additional capacitive elements 120 ($C_{S1}$-$C_{S5}$ and $C_{P1}$-$C_{P4}$), each of which is in parallel with a respective one of the acoustic resonators ($Z_{S1}$-$Z_{S5}$ and $Z_{P1}$-$Z_{P4}$). Each of the capacitive elements 120 may, e.g., have a capacitance in the range of 0.5 pF-2.0 pF, specifically, in the range of 0.8 pF-1.5 pF, and more specifically, in the range of 0.9 pF-1.1 pF. Referring to FIG. 6, each of the acoustic resonators Z of the enhanced filter 200 can be replaced with the MBVD model 110 illustrated in FIG. 3.

Figure 7:
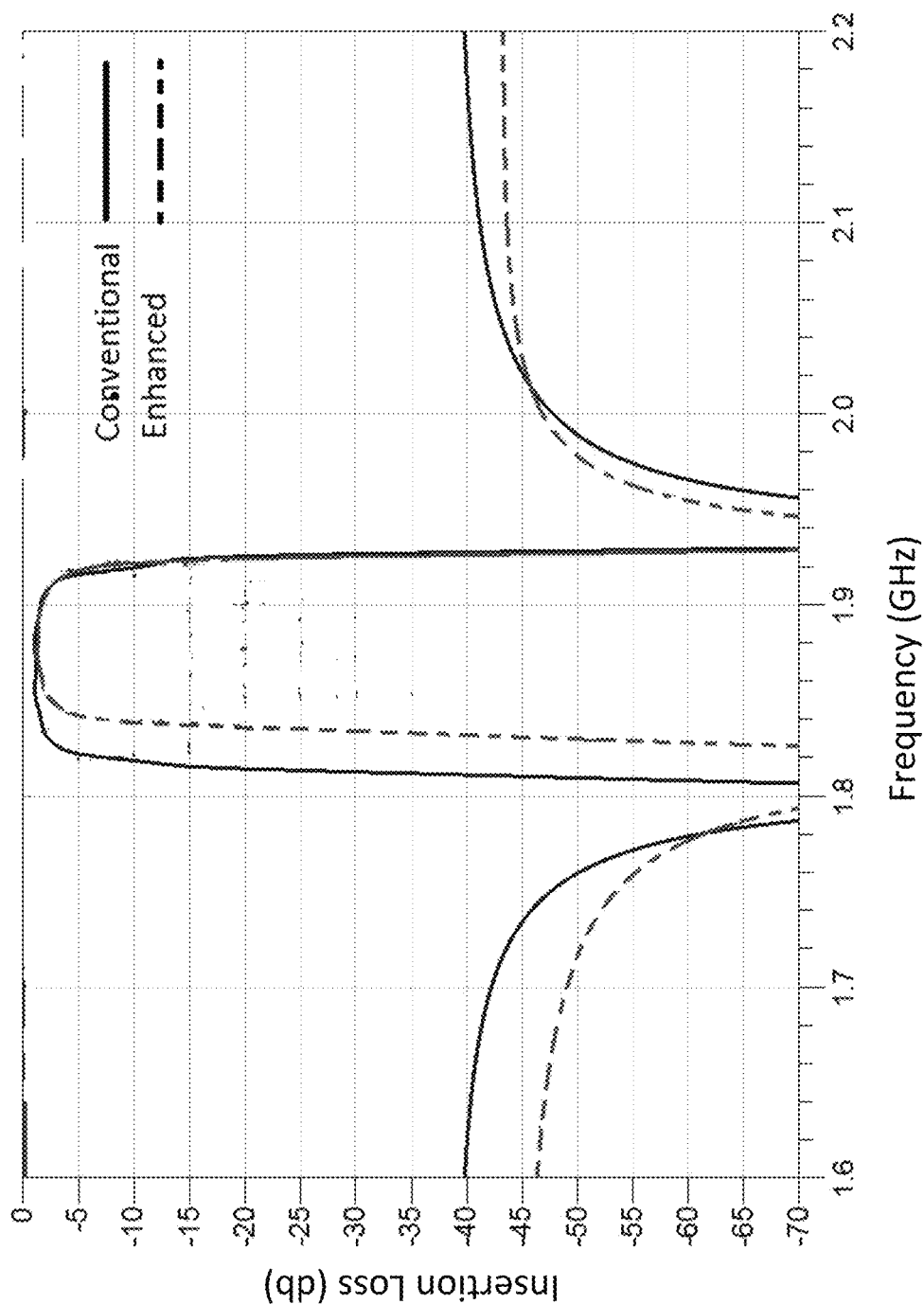
FIG. 7 is a frequency response plot comparing the passbands of the conventional acoustic filter of FIG. 3 and the enhanced acoustic filter of FIG. 5.
Figure 8:
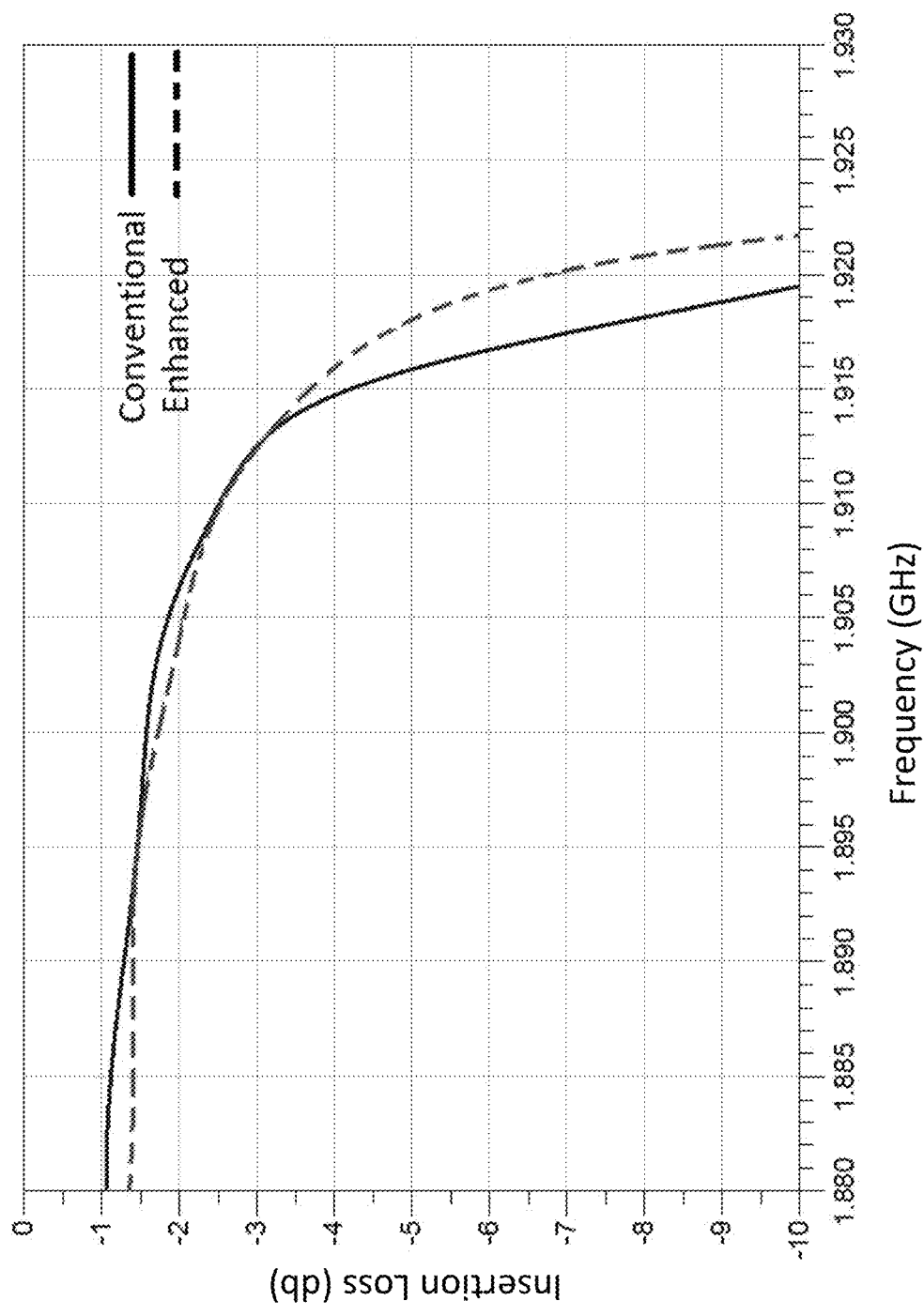
FIG. 8 is a frequency response plot comparing the upper edges of the passbands of the conventional acoustic filter of FIG. 3 and the enhanced acoustic filter of FIG. 5.
Figure 9:
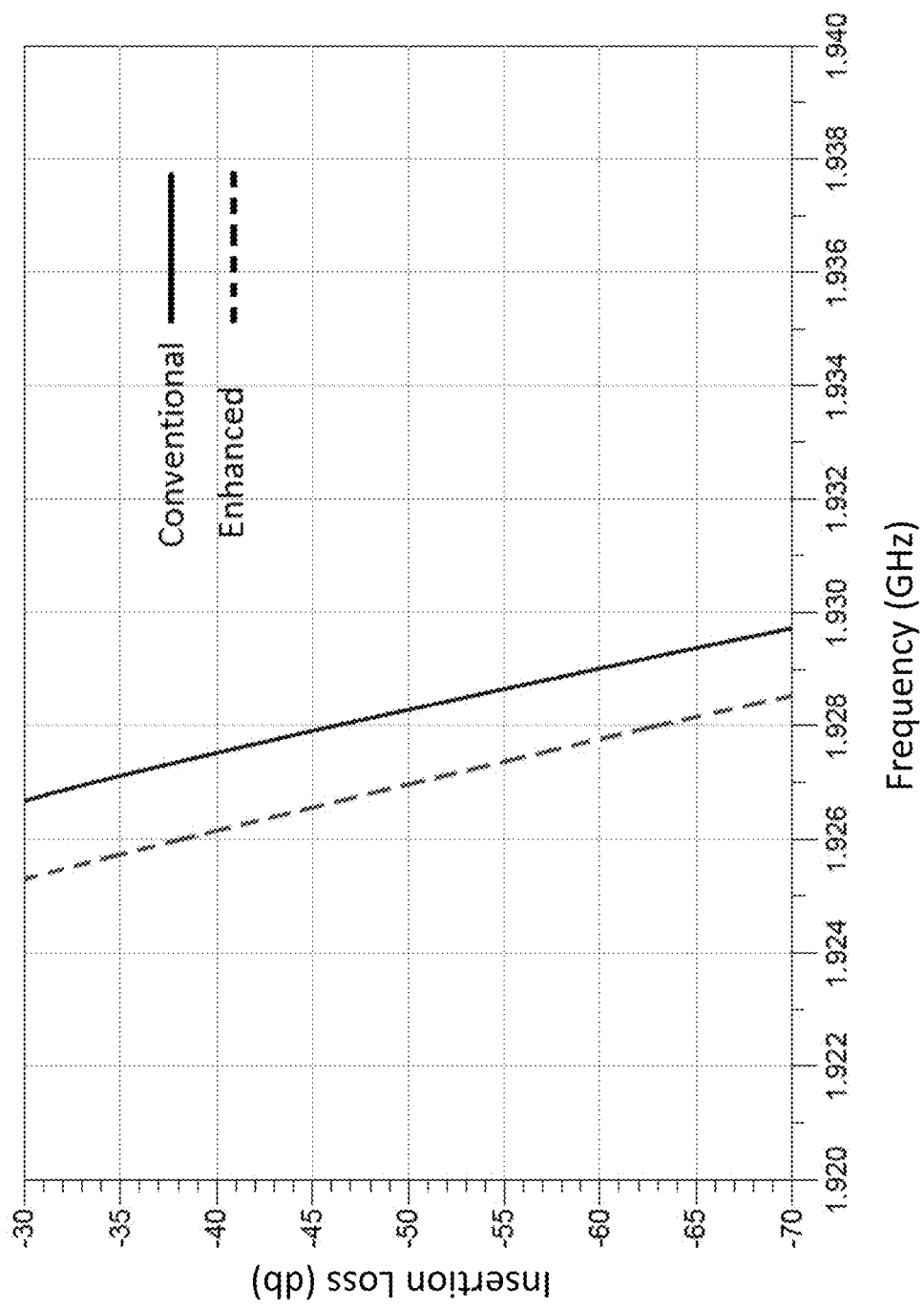
FIG. 9 is another frequency response plot comparing the upper edges of the passbands of the conventional acoustic filter of FIG. 3 and the enhanced acoustic filter of FIG. 5.
Figure 10:
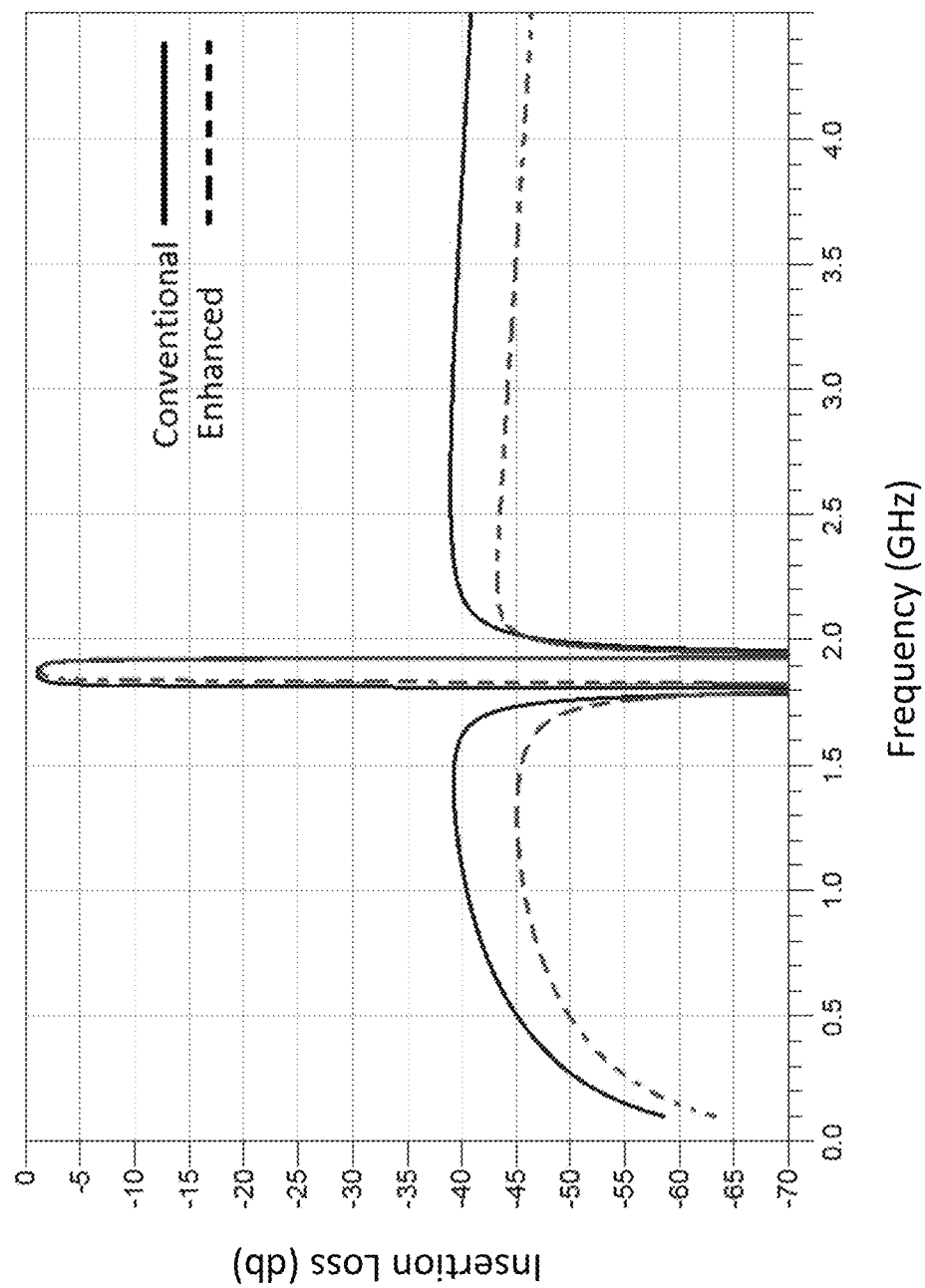
FIG. 10 is a frequency response plot comparing the out-of-band rejection of the conventional acoustic filter of FIG. 3 and the enhanced acoustic filter of FIG. 5.

As illustrated in FIG. 7, a simulated frequency response of the enhanced band-pass filter 200, where the values $C_{S1}$, $C_{S2}$, $C_{S3}$, $C_{S4}$, and $C_{S5}$ are set to 0.4 pF, and the values of $C_{P1}$, $C_{P2}$, $C_{P3}$, and $C_{P4}$ are set to 0.0 pF, can be compared to the simulated frequency response of the conventional band-pass filter 100 in terms of insertion loss $|S21|^2$. The enhanced frequency response has been aligned to the conventional acoustic filter at the upper −3 dB insertion loss point for comparison of the slopes at the upper sides of the passbands. As there shown, the lower edge of the passband of the enhanced band-pass filter 200 is sharper than the lower edge of the nominal passband of the conventional band-pass filter 100. As best illustrated in FIGS. 8 and 9, when the upper passband edges of the filters 100 and 200 are aligned at their respective −3 dB frequencies, it can be seen the enhanced filter 200 has improved rejection over that of the conventional filter 100 at the upper edge of the passband. As further shown in FIG. 10, the band-pass filter 200 has a substantially improved out-of-band rejection compared to that of the band-pass filter 100.

The capacitive elements 120 can be easily incorporated into an already existing conventional filter structure to create the band-pass filter 200. For example, as shown in FIGS. 11a and 11b, a portion of the filter 200a comprises a piezoelectric layer 252, and a metalized signal plane 254, acoustic resonator structure 258a, and a distinct lumped capacitive structure 260a all monolithically disposed on the piezoelectric layer 252. The piezoelectric layer 252 may be, e.g., a piezoelectric substrate or may be monolithically disposed on a non-piezoelectric substrate, e.g., as a thin-film piezoelectric. The signal plane 254 comprises an input signal plane portion 254a and an output signal plane portion 254b. The acoustic resonator structure 258a, which corresponds to one of the in-line resonators $Z_S$ in FIG. 5, is electrically coupled between the input signal plane portion 254a and the output signal plane portion 254b, and in the illustrated embodiment, is directly connected to the input signal plane portion 254a and output signal plane portion 254b. The acoustic resonator structure 258a comprises an interdigitated transducer (IDT) 262 formed by a plurality of interdigitated resonator fingers 266, for generating the acoustic waves, and an optional reflector 264 for reflecting the acoustic waves back into the IDT 262. The lumped capacitive structure 260 is shown coupled to both ends of the acoustic resonator structure 258a, and in particular, is directly electrically coupled between the input signal plane portion 254a and output signal plane portion 254b, and in the illustrated embodiment, is directly connected to the input signal plane portion 254a and output signal plane portion 254b. Similar to the IDT 262, the lumped capacitive structure 260a comprises a plurality of interdigitated capacitive fingers 268. However, the interdigitated capacitive fingers 268 are orthogonal to the interdigitated resonator fingers 266 to avoid excitation of acoustic waves.

Figure 12:
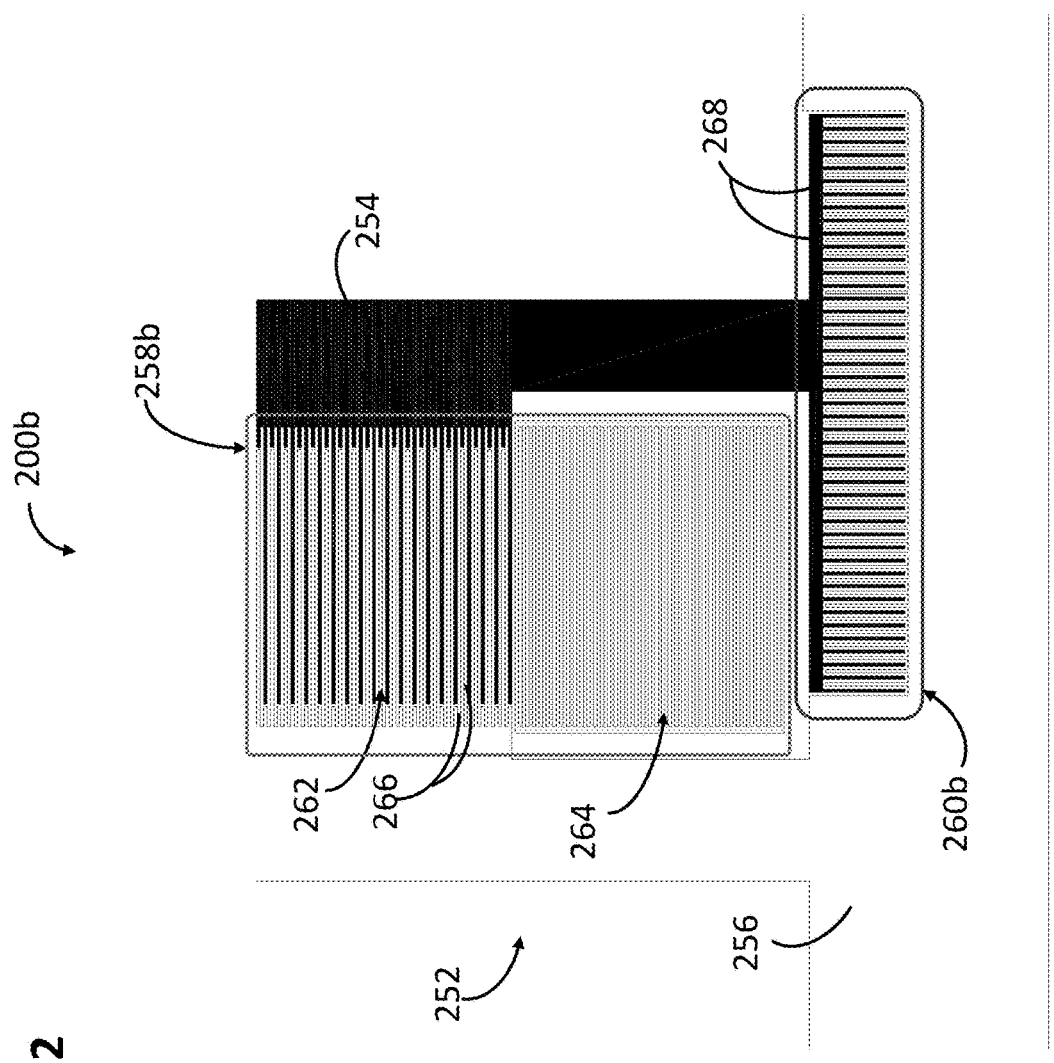
FIG. 12 is a plan view of an actual in-shunt acoustic resonator with an additional capacitive element fabricated for use in the enhanced acoustic filter of FIG. 5.

As another example, as shown in FIG. 12, another portion of the filter 200b comprises the piezoelectric layer 252 and the signal plane 254, a metallized ground plane 256, an acoustic resonator structure 258b, and a distinct lumped capacitive structure 260b all monolithically disposed on the piezoelectric layer 252. The acoustic resonator structure 258b, which corresponds to one of the in-shunt resonators $Z_P$ in FIG. 5, is electrically coupled between the signal plane 254 and the ground plane 256. Like the acoustic resonator structure 258a, the acoustic resonator structure 258b comprises an IDT 262 formed by a plurality of interdigitated resonator fingers 266, for generating the acoustic waves, and an optional reflector 264 for reflecting the acoustic waves back into the IDT 262. The lumped capacitive structure 260b is shown coupled to both ends of the acoustic resonator structure 258b, and in particular, is directly electrically coupled between the signal plane 254 and ground plane 256, and in the illustrated embodiment is directly connected to the signal plane 254 and ground plane 256. Similar to the IDT 262, the lumped capacitive structure 260b comprises a plurality of interdigitated capacitive fingers 268 that are orthogonal to the interdigitated resonator fingers 266 to avoid excitation of acoustic waves.

Significantly, although the lumped capacitive structure 260b can be connected some distance away from the signal plane 254 and ground plane 256, the interdigitated capacitive fingers 268 are at least partially nested within one or both of the signal plane 254 and ground plane 256 in order to utilize the limited space on the piezoelectric layer 252. In this manner, the lumped capacitive structure 260b can be more easily incorporated into an already existing filter layout. In the illustrated embodiment, the interdigitated capacitive fingers 268 are fully nested within the ground plane 256. In alternative embodiments, the interdigitated capacitive fingers 268 of the lumped capacitive structure 260a may be at least partially nested, and perhaps fully nested, within one or both of the input signal plane portion 254a and output signal plane portion 254b illustrated in FIG. 11b.

Referring to FIGS. 13-17, the theory supporting the improved out-of-band rejection of the band-pass filter 200 relative to that of the conventional band-pass filter 100 will now be described. Referring first to FIG. 13a-13c, a conventional single section band-pass filter circuit 300 may have a single acoustic resonator pair 302 consisting of a series (or in-line) acoustic resonator $Z_S$ and a parallel (or in-shunt) acoustic resonator $Z_P$ (FIG. 13a). Four of such acoustic resonator pairs can be found in the conventional band-pass filter 100 or the enhanced band-pass filter 200. For example, the acoustic resonators pairs may be identified in the filters 100, 200 as the resonators $Z_{S1}/Z_{P1}$, $Z_{S2}/Z_{P2}$, $Z_{S3}/Z_{P3}$, and $Z_{S4}/Z_{P4}$, or as the resonators $Z_{P1}/Z_{S2}$, $Z_{P2}/Z_{S3}$, $Z_{P3}/Z_{S4}$, and $Z_{P4}/Z_{S5}$. As illustrated in FIG. 13b, each of the acoustic resonators Z of the filter circuit 300 can be replaced with the BVD model 100' (i.e., the MBVD model 110 illustrated in FIG. 3 without the resistance R) to create an equivalent filter circuit, and modeled to create a passband having the profile represented by the |S21|² frequency response illustrated in FIG. 13c.

Let the resonance and anti-resonance frequencies of the series resonator $Z_S$ be respectively designated as $\omega_{rs}$ and $\omega_{as}$, and the resonance and anti-resonance frequencies of each of the shunt resonator $Z_P$ be respectively designated as $\omega_{rp}$ and $\omega_{ap}$. When $\omega_{rs}$ and $\omega_{ap}$ are approximately equal to each other, reflection zeroes at $\omega=\omega_{rs}$, $\omega_{ap}$ defining a passband centered near $\omega=\omega_{rs}$, $\omega_{ap}$ are created, and transmission zeroes at $\omega=\omega_{rp}$, $\omega_{as}$ defining the passband edges are created. Transforming the frequencies $\omega$ from radians into Hertz yields $F_a = \omega_{rp}/2\pi$, $F_b = \omega_{rs}/2\pi$, $F_c = \omega_{ap}/2\pi$, and $F_d = \omega_{as}/2\pi$.

Figure 13A:
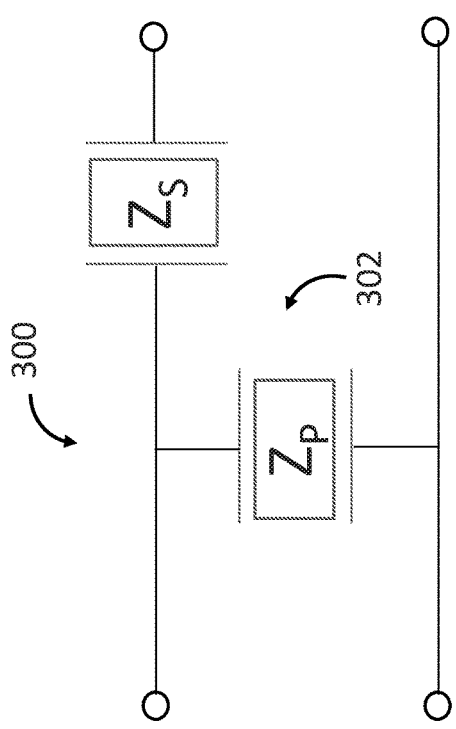
FIG. 13a is a schematic diagram of a conventional single section band-pass acoustic filter circuit.
Figure 13B:
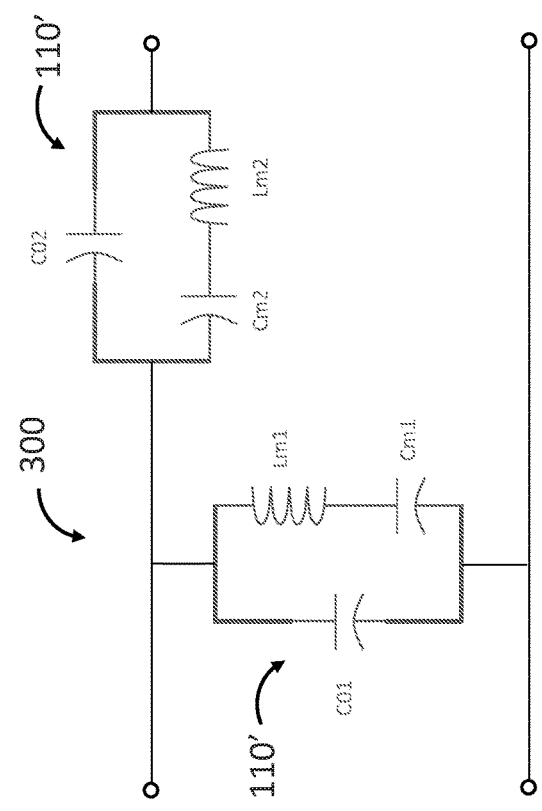

The parameters in the equivalent filter circuit 300 of FIG. 13b are related by the following equations:

$$\omega_r = \frac{1}{\sqrt{L_m C_m}}; \quad [1]$$

$$\frac{\omega_a}{\omega_r} = \sqrt{1 + \frac{1}{\gamma}}, \quad [2]$$

where $\omega_R$ and $\omega_A$ may be the respective resonance and anti-resonance frequencies for any given acoustic resonator, and gamma $\gamma$ may depend on a material's property, which may be further defined by:

$$\frac{C_0}{C_m} = \gamma. \quad [3]$$

It can be appreciated from equation [1] that the resonant frequency of each of the acoustic resonators will depend on the motional arm of the BVD model 110', whereas the filter characteristics (e.g., bandwidth) will be strongly influenced by $\gamma$ in equation [2]. The Quality factor (Q) for an acoustic resonator may be an important figure of merit in acoustic filter design, relating to the loss of the element within the filter. Q of a circuit element represents the ratio of the energy stored per cycle to the energy dissipated per cycle. The Q factor models the real loss in each acoustic resonator, and generally more than one Q factor may be required to describe the loss in an acoustic resonator. Q factors may be defined as follows for the filter examples. The motional capacitance $C_m$ may have an associated Q defined as $QC_m = 10^8$; the static capacitance $C_0$ may have an associated Q defined as $QC_0 = 200$; and motional inductance $L_m$ may have an associated Q defined as $QL_m = 1000$. Circuit designers may typically characterize SAW resonators by resonant frequency $\omega_R$, static capacitance $C_0$, gamma $\gamma$, and Quality factor $QL_m$. For commercial applications, $QL_m$ may be about 1000 for SAW resonators, and about 3000 for BAW resonators. Typical $\gamma$ values may range from about 12 to about 18 for 42-degree X Y cut LiTaO₃.

Figure 13C:
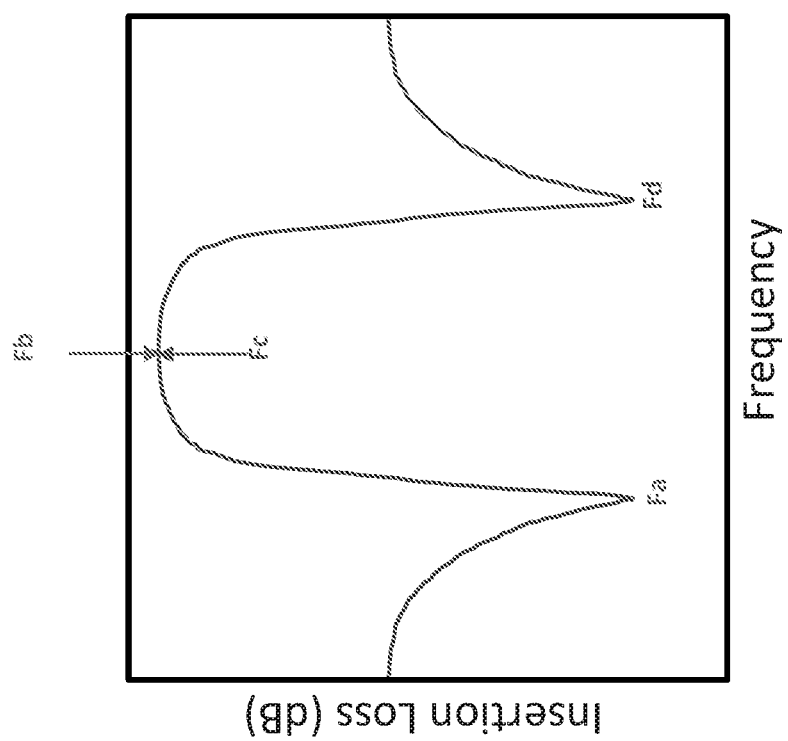
FIG. 13c is a frequency response plot of the passband of the conventional acoustic filter of FIG. 13b.

Using the standard resonance formula:

$$f = \frac{1}{2\pi\sqrt{LC}}, \quad [4]$$

wherein f is the frequency in hertz, L is the inductance in henrys, and C is the capacitance in farads, the transmission zeroes and reflection zeroes of the equivalent filter circuit of FIG. 13c can be computed as follows. The transmission zero at the lower edge of the passband is effectively the resonance created by the circuit $L_{m1}$ and $C_{m1}$ (i.e., the resonance of the acoustic resonator $Z_P$) and is given by:

$$F_a = \frac{1}{2\pi\sqrt{L_{m1} \cdot C_{m1}}}. \quad [5]$$

This resonance creates an effective short circuit to the return path and no power is transmitted from the input to the output of the filter. One reflection zero located in the passband is effectively the resonance created by the circuit $L_{m1}$, $C_{m1}$, and $C_{01}$ (i.e., the anti-resonance of the acoustic resonator $Z_P$) and is given by:

$$F_b = \frac{1}{2\pi\sqrt{\frac{L_{m1} \cdot C_{m1} \cdot C_{01}}{C_{m1} + C_{01}}}}. \quad [6]$$

This resonance creates an effective open circuit to the return path, allowing power to be transmitted from the input to the output of the filter. The other reflection zero located in the passband is effectively the resonance created by the circuit $L_{m2}$ and $C_{m2}$ (i.e., the resonance of the acoustic resonator $Z_S$) and is given by:

$$F_c = \frac{1}{2\pi\sqrt{L_{m2} \cdot C_{m2}}}. \quad [7]$$

This resonance creates an effective short circuit, allowing power to be transmitted from the input to the output of the filter. The transmission zero at the upper edge of the passband is effectively the resonance created by the circuit $L_{m2}$, $C_{m2}$, and $C_{02}$ (i.e., the anti-resonance of the acoustic resonator $Z_S$) and is given by:

$$F_d = \frac{1}{2\pi\sqrt{\frac{L_{m2} \cdot C_{m2} \cdot C_{02}}{C_{m2} + C_{02}}}}. \quad [8]$$

This resonance creates an effective open circuit to the return path, preventing power from being transmitted from the input to the output of the filter.

Referring to FIG. 14a-14c, it can be seen that the bandwidths of acoustic filters 300a-300c are tightly coupled to the spacing between the frequencies $F_a$ and $F_b$ and the spacing between the frequencies $F_c$ and $F_d$. As can be appreciated from FIG. 15, a comparison of the frequency responses of these acoustic filters reveals that, as these spacings become larger, the relative bandwidths of acoustic filters increase and the slopes of the passbands of the acoustic filters become more shallow (see frequency response of the acoustic filter circuit 300c). In contrast, as these spacings become smaller, the relative bandwidths of these acoustic filters decrease and the slopes of the passbands of the acoustic filters become steeper (see frequency response of the acoustic filter circuit 300a).

Figure 16A:
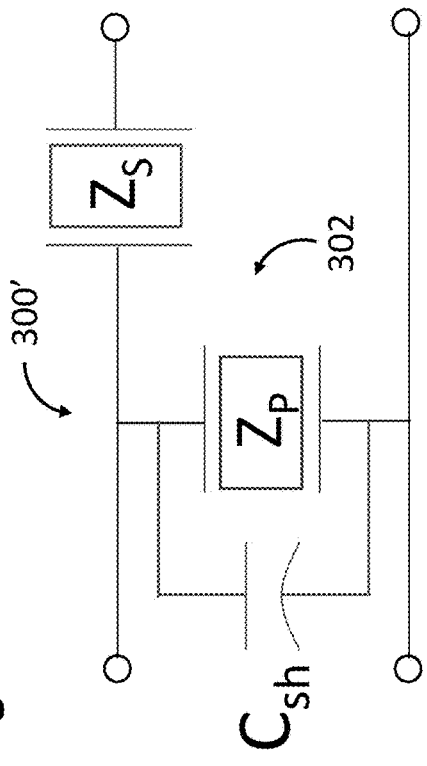
FIG. 16a is a schematic diagram of an enhanced single section band-pass acoustic filter circuit, wherein a capacitive element is added in parallel with the in-shunt resonator.
Figure 16B:
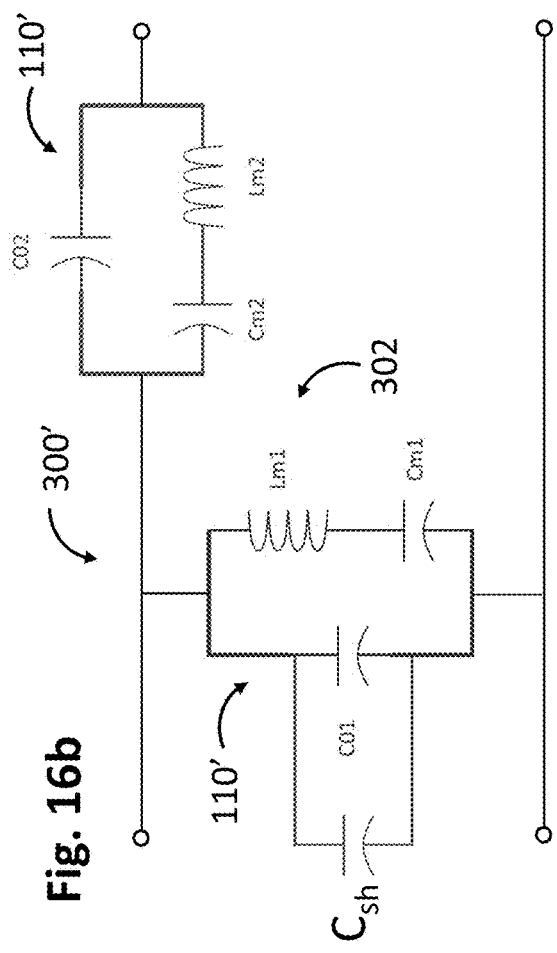
Figure 16C:
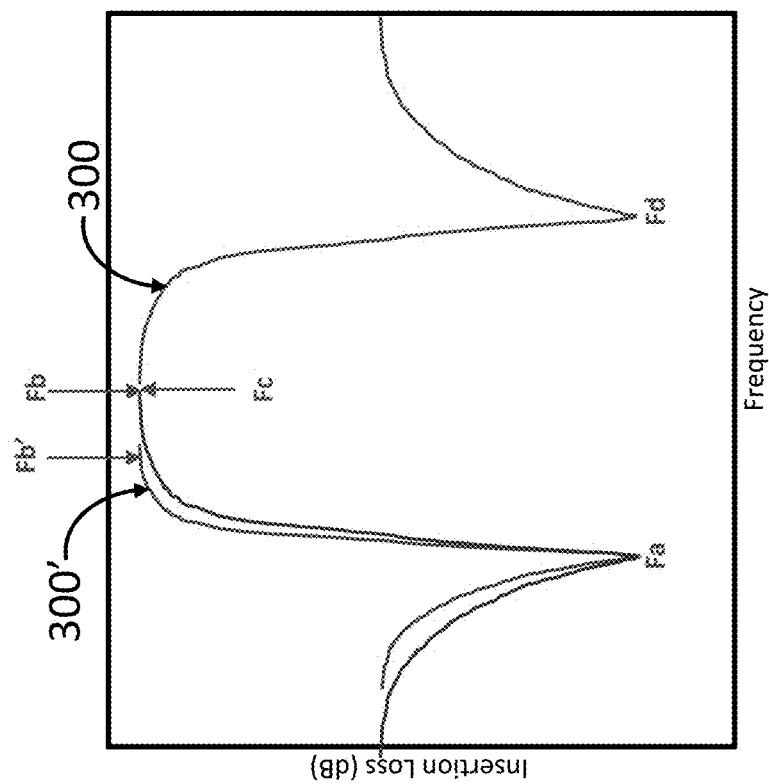
FIG. 16c is a frequency response plot of the passband of the enhanced acoustic filter of FIG. 16b.

Referring now to FIG. 16a-16c, assume that a capacitance $C_{sh}$ is added in parallel with the shunt acoustic resonator $Z_P$ of the original filter circuit 300 (FIG. 16*a*), and the shunt acoustic resonator $Z_P$ is replaced with the BVD model 110' to create a new filter circuit 300' (FIG. 16*b*), which yields an $|S21|^2$ frequency response in comparison with the $|S21|^2$ frequency response of the original filter circuit 300 (FIG. 16*c*).

In the new filter circuit 300', the transmission zero located at the lower edge of the passband is effectively the resonance created by the circuit $L_{m1}$ and $C_{m1}$ (i.e., the resonance of the acoustic resonator $Z_P$). This transmission zero, therefore, remains unchanged with the addition of the capacitance $C_{sh}$, and is thus, located at the frequency $F_a$ given by equation [5] above. One reflection zero located in the passband is effectively the resonance created by the circuit $L_{m1}$ and $C_{m1}$ (i.e., the resonance of the acoustic resonator $Z_P$).

This transmission zero, therefore, remains unchanged with the addition of the capacitance $C_{sh}$, and is thus, located at the frequency $F_a$ given by equation [5] above. One reflection zero located in the passband is effectively the resonance created by the circuit $L_{m1}$, $C_{m1}$, and $C_{01}$ (i.e., the anti-resonance of the acoustic resonator $Z_P$) in parallel with the capacitance $C_{sh}$, and is given by:

$$F_b' = \frac{1}{2\pi \sqrt{\frac{L_{m1} \cdot C_{m1} \cdot (C_{01} + C_{sh})}{C_{m1} + C_{01} + C_{sh}}}}. \quad [9]$$

The relationship between the reflection zero $F_b$ in equation [6] and the reflection zero $F_b'$ in equation [9] can be determined by assigning values to the lumped elements and solving equations [6] and [9]. Setting $L_{m1}=C_{m1}=C_{01}=1$, then $$F_b = \frac{k}{\sqrt{0.5}}$$

and $$F_b' = \frac{k}{\sqrt{\frac{1 + C_{sh}}{2 + C_{sh}}}},$$

where k is a constant. When $C_{sh}=0$, $F_b=F_b'$. For any positive values of $C_{sh}$, then $F_b'<F_b$.

As can be appreciated from the foregoing, the result of adding a capacitance $C_{sh}$ in parallel with the shunt resonator $Z_P$ does not affect the location of the transmission zero $F_a$, but causes the reflection zero $F_b$ to move down in frequency to $F_b'$. Because the filter match is affected (degraded), the transmission zero $F_a$ can be moved higher to return the filter match to its original response, which also narrows the filter bandwidth. The resulting filter has a steeper skirt on the lower side of the passband.

Figure 17C:
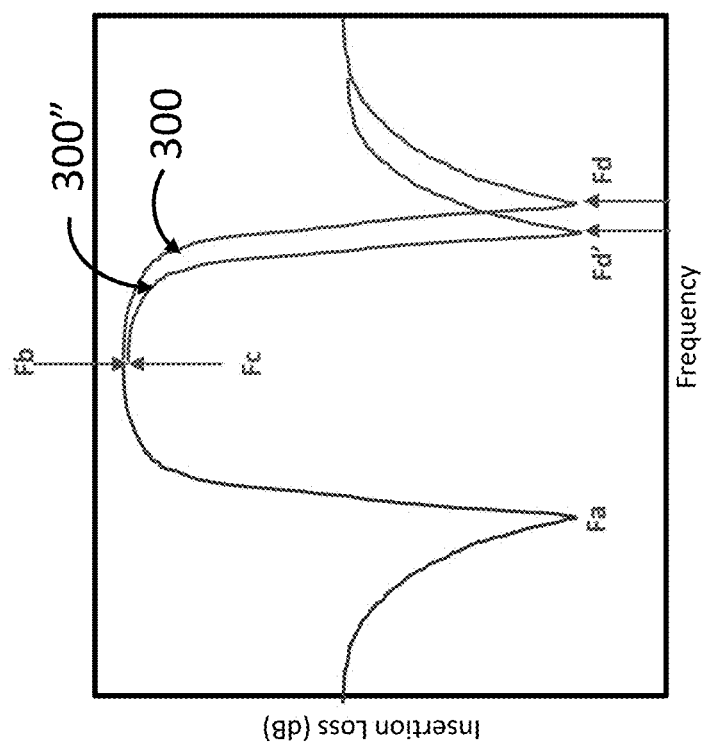
FIG. 17c is a frequency response plot of the passband of the enhanced acoustic filter of FIG. 17b.

Referring now to FIG. 17*a*-17*c*, assume that a capacitance $C_{se}$ is added in parallel with the in-line acoustic resonator $Z_S$ of the original filter circuit 300 (FIG. 17*a*), and the in-line acoustic resonator $Z_S$ is replaced with the MBVD model 110 illustrated in FIG. 3 to create a new filter circuit 300" (FIG. 17*b*), which yields an $|S21|^2$ frequency response in comparison with the $|S21|^2$ frequency response of the original filter circuit 300 (FIG. 17*c*).

In the new filter circuit 300", the reflection zero located in the passband is effectively the resonance created by $L_{m2}$ and $C_{m2}$ (i.e., the resonance of the acoustic resonator $Z_S$). This reflection zero, therefore, remains unchanged with the addition of the capacitance $C_{se}$, and is thus, located at the frequency $F_c$ given by equation [7] above. The transmission zero located at the right edge of the passband is effectively the resonance created by the circuit $L_{m2}$, $C_{m2}$, and $C_{02}$ (i.e., the anti-resonance of the acoustic resonator $Z_S$), and is given by:

$$F_d' = \frac{1}{2\pi \sqrt{\frac{L_{m2} \cdot C_{m2} \cdot (C_{02} + C_{se})}{C_{m2} + C_{02} + C_{se}}}}. \quad [10]$$

The relationship between the transmission zero $F_d$ in equation [8] and the transmission zero $F_d'$ in equation [10] can be determined by assigning values to the lumped elements and solving equations [8] and [10]. Setting $L_{m2}=C_{m2}=C_{02}=1$, then $$F_d = \frac{k}{\sqrt{0.5}}$$

and $$F_d' = \frac{k}{\sqrt{\frac{1 + C_{se}}{2 + C_{se}}}},$$

where k is a constant. When $C_{se}=0$, $F_d=F_d'$. For any positive values of $C_{se}$, then $F_d'<F_d$.

As can be appreciated from the foregoing, the result of adding a capacitance $C_{se}$ in parallel with the in-line resonator $Z_S$ does not affect the location of the reflection zero $F_c$, but causes the transmission zero $F_d$ to move down in frequency to $F_d'$. The filter match is not greatly affected, and the frequency response of the resulting filter is narrower and also steeper on the high side of the passband.

Thus, adding capacitance in parallel to shunt resonators of an acoustic filter narrows and steepens the lower edge of the passband, while adding capacitance in parallel to in-line resonators of an acoustic filter narrows and steepens the upper edge of the passband. It follows that adding capacitance in parallel to both the shunt and in-line resonators of an acoustic filter narrows and steepens both edges of the passband. Thus, narrower filters can be realized with piezoelectric materials that are normally used for wider bandwidth filters. By making the acoustic filter narrower, the passband insertion loss increases and the filter skirts become steeper. The benefits of increasing the steepness of the passband can be realized by moving the entire filter up or down in frequency to maximize customer specification from band edge to rejection frequencies.

Figure 18:
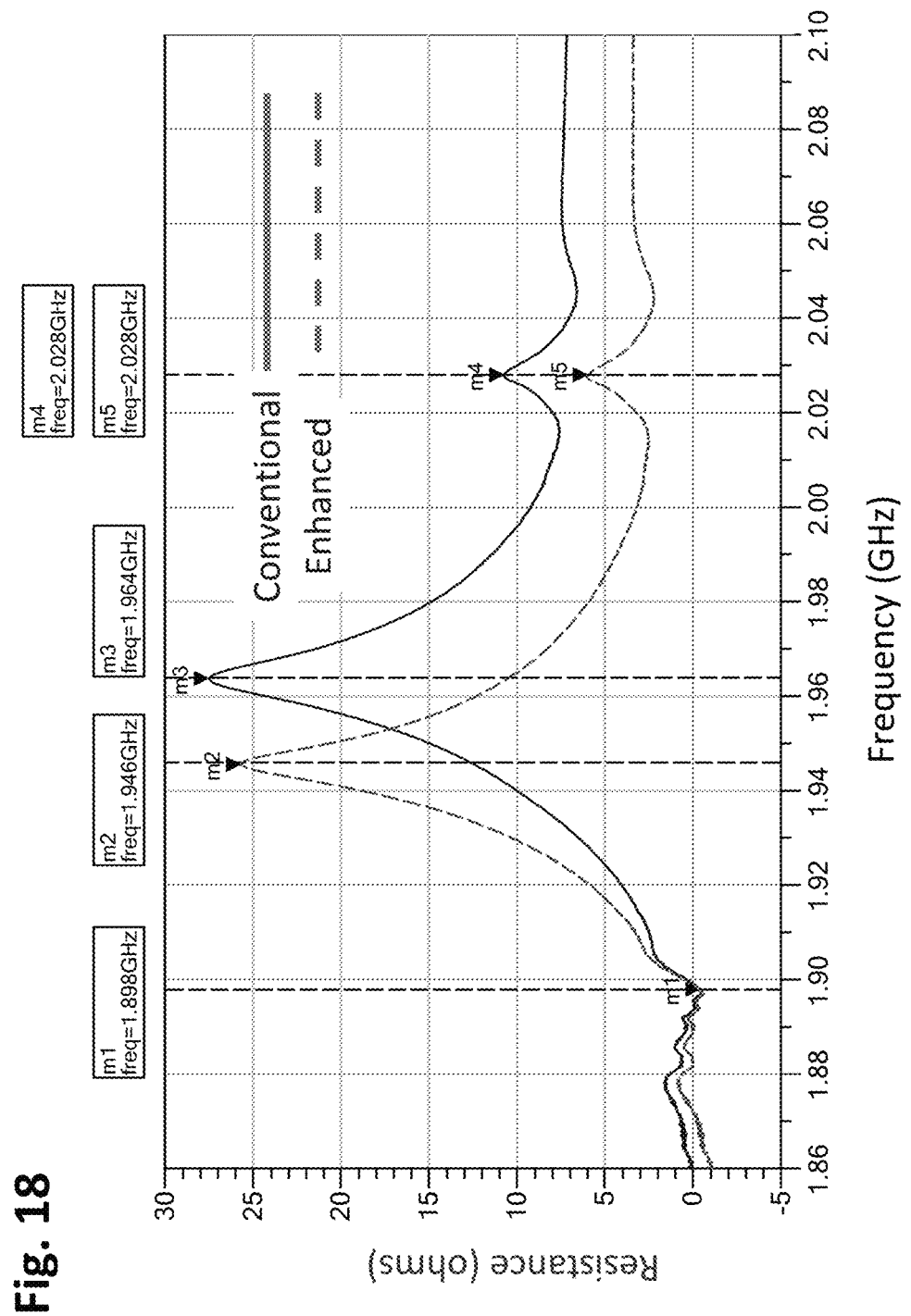
FIG. 18 is a frequency response plot comparing an enhanced acoustic resonator with a conventional acoustic resonator.

Adding capacitance in parallel to shunt resonators of the acoustic filter also effectively moves the upper Bragg Band resonance further from the passband. For example, referring to FIG. 18, the frequency response (in terms of the real impedance) of a conventional shunt resonator without an added parallel capacitance, and the frequency response (in terms of real impedance) of an enhanced shunt resonator with an added parallel capacitance of 1.0 pF can be compared. The resonances of both the conventional acoustic resonator and the enhanced acoustic resonator are the same and are shown at marker m1 (1.898 GHz). Likewise, the upper Bragg Band frequencies of both the conventional acoustic resonator and the enhanced acoustic resonator are the same and are shown at markers m4 and m5 (2.028 GHz). The anti-resonance of the conventional acoustic resonator is shown at marker m3 (1.964 GHz), while the anti-resonance of the enhanced acoustic resonator is shown at marker m2 (1.964 GHz). As can be appreciated, for the conventional acoustic resonator, the upper Bragg band frequency at marker m4 is higher than the anti-resonant frequency at marker m3 by 64 MHz, whereas for the enhanced acoustic resonator, the upper Bragg band frequency at marker m5 is higher than the anti-resonant frequency at marker m2 by 82 MHz. Thus, if the enhanced acoustic resonator is designed so that the anti-resonance falls at the center of the passband of the bandpass filter, the additional parallel capacitance will pushes the upper Bragg Band frequency higher away from the passband.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. An acoustic filter, comprising:
   a piezoelectric layer;
   an acoustic resonator structure monolithically disposed on the piezoelectric layer;
   a lumped capacitive structure monolithically disposed on the piezoelectric layer and being electrically coupled in parallel with the acoustic resonator structure;
   a metalized signal plane monolithically disposed on the piezoelectric layer;
   a metalized ground plane monolithically disposed on the piezoelectric layer;
   wherein each of the acoustic resonator structure and the lumped capacitive structure is electrically coupled to one of the metalized signal plane and the metalized ground plane, with the lumped capacitive structure being entirely nested within the one of the metalized signal plane and the metalized ground plane.

2. The acoustic filter of claim 1, wherein each of the acoustic resonator structure and the lumped capacitive structure is electrically coupled between the metalized signal plane and the metalized ground plane.

3. The acoustic filter of claim 1, wherein the acoustic resonator structure is directly connected to the one of the metalized signal plane and the metalized ground plane.

4. The acoustic filter of claim 1, wherein the lumped capacitive structure is directly connected to the one of the metalized signal plane and the metalized ground plane.

5. The acoustic filter of claim 1, wherein the one of the metalized signal plane and the metalized ground plane is the metalized signal plane.

6. The acoustic filter of claim 1, wherein the one of the metalized signal plane and the metalized ground plane is the metalized ground plane.

7. The acoustic filter of claim 1, wherein the metalized signal plane comprises a metalized input signal plane portion and a metalized output signal plane portion, wherein each of the acoustic resonator structure and the lumped capacitive structure is electrically coupled between the metalized input signal plane portion and the metalized output signal plane portion.

8. The acoustic filter of claim 7, wherein the lumped capacitive structure is entirely nested within at least one of the input signal plane portion and the output signal plane portion.

9. The acoustic filter of claim 1, wherein the acoustic resonator structure comprises an arrangement of planar interdigitated resonator fingers, and the lumped capacitive structure comprises an arrangement of planar interdigitated capacitive fingers.

10. The acoustic filter of claim 9, wherein the interdigitated capacitive fingers and interdigitated resonator fingers are orthogonal to each other.

11. The acoustic filter of claim 1, wherein the piezoelectric layer is a piezoelectric substrate.

12. The acoustic filter of claim 1, further comprising a non-piezoelectric substrate, wherein the piezoelectric layer is monolithically disposed on the non-piezoelectric substrate.

13. The acoustic filter of claim 12, wherein the piezoelectric layer is a thin-film piezoelectric.

* * * * *